US008233510B2

(12) United States Patent
Joyner et al.

(10) Patent No.: US 8,233,510 B2
(45) Date of Patent: Jul. 31, 2012

(54) DUAL OUTPUT LASER SOURCE

(75) Inventors: Charles H. Joyner, Sunnyvale, CA (US); Radhakrishnan L. Nagarajan, Cupertino, CA (US); Peter W. Evans, Mountain House, CA (US); Masaki Kato, Palo Alto, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 12/363,826

(22) Filed: Feb. 2, 2009

(65) Prior Publication Data

US 2009/0279576 A1   Nov. 12, 2009

Related U.S. Application Data

(60) Provisional application No. 61/028,719, filed on Feb. 14, 2008, provisional application No. 61/030,806, filed on Feb. 22, 2008.

(51) Int. Cl.
*H01S 3/10* (2006.01)
(52) U.S. Cl. ........ 372/26; 372/29.021; 372/96; 398/184
(58) Field of Classification Search ...................... 372/26
See application file for complete search history.

(56) References Cited

U.S. PATENT DOCUMENTS

| 4,740,987 | A | * | 4/1988 | McCall et al. | ................. 372/96 |
| 5,963,567 | A | * | 10/1999 | Veselka et al. | ................. 372/21 |
| 6,385,217 | B1 | * | 5/2002 | Singh et al. | ................. 372/20 |
| 6,411,642 | B1 | * | 6/2002 | Mazed | ................. 372/103 |
| 2001/0043384 | A1 | * | 11/2001 | Ishizaka | ................. 359/248 |
| 2002/0018501 | A1 | * | 2/2002 | Hatakoshi et al. | ................. 372/43 |
| 2002/0145787 | A1 | | 10/2002 | Shpantzer et al. | |
| 2005/0013331 | A1 | * | 1/2005 | Kish et al. | ................. 372/32 |
| 2005/0084202 | A1 | * | 4/2005 | Smith et al. | ................. 385/14 |

FOREIGN PATENT DOCUMENTS

EP         1742389        10/2010
WO      WO2007/103410      9/2007

OTHER PUBLICATIONS

Griffin et al., "Integrated DQPSK transmitter for dispersion—tolerant and dispersion-managed DWDM transmission", Optical Fiber Communications Conference, 2003, pp. 770-771.
Serbay et al., "Comparison of six different RZ-DQPSK transmitter set-ups regarding their tolerance towards fibre impairments in 8×40Gb/s WDM-systems" Advanced Modulation Formats, 2004, EIII/LEOS Workshop, IEEE, pp. 9-10.
Cole et al., "100GbE Optical LAN Technologies [Applicants & Practice]" IEEE Communications Magazine, vol. 45, No. 12, Dec. 2007, pp. 12-19.
Doerr et al., "Monolithic DQPSK Receiver in InP With Low Polarization Sensitivity" IEEE Photonics Technology Letters, vol. 19, No. 21, Nov. 2007, pp. 1765-1767.

* cited by examiner

*Primary Examiner* — Jessica Stultz
*Assistant Examiner* — Xinning Niu
(74) *Attorney, Agent, or Firm* — Duane Morris LLP; David L. Soltz

(57) ABSTRACT

A dual output laser source provided on a substrate outputs light from a first and second output. A portion of the light generated by the laser is supplied to a first modulator via the first output. A second portion of the light generated by the laser is supplied to a second modulator via the second output. The first modulator is provided on the substrate and generates a first modulated signal. The second modulator is also provided on the substrate and generates a second modulated signal. Each output of the laser is used to provide continuous wave light sources to components on photonic integrated circuit.

28 Claims, 3 Drawing Sheets

US 8,233,510 B2

DUAL OUTPUT LASER SOURCE

CROSS-REFERENCE TO RELATED APPLICATIONS

This application claims priority to U.S. Provisional Application No. 61/028,719 filed Feb. 14, 2008 and U.S. Provisional Application No. 61/030,806 filed Feb. 22, 2008 both of which are herein incorporated by reference in their entirety.

BACKGROUND OF THE INVENTION

1. Field of the Invention

Embodiments of the invention relate to the field of optical communication devices. More particularly, the present invention relates to an optical circuit providing a dual output laser source used for an optical communication system.

2. Discussion of Related Art

Wavelength division multiplexed (WDM) optical communication systems are known in which multiple optical signals, each having a different wavelength, are combined onto a single optical fiber. Such systems typically include a laser light source associated with each wavelength, a modulator configured to modulate the output of the laser, and an optical combiner to combine each of the modulated outputs. Conventionally, WDM systems have been constructed from discrete components. For example, the lasers, modulators and combiners have been packaged separately and mounted on a printed circuit board. More recently, however, many WDM components including transmitters, receivers and passive devices have been integrated onto a single chip also referred to as a photonic integrated circuit (PIC) chip.

Typically, these transmitters include a plurality of semiconductor lasers which provide continuous wave (CW) light signals to an optical circuit. Each of these lasers supply light at a particular wavelength where each wavelength is associated with a respective optical channel within a known WDM communications channel grid (e.g. ITU). Each of a plurality of modulators receive the CW light signals as well as respective data streams and output modulated optical signals at each particular wavelength. One type of semiconductor laser is a distributed feedback (DFB) laser which employs a diffraction grating structure that couples both forward and backward propagating coherent light produced in an active region of a semiconductor substrate. Lasers are considered active components because they require electrical power to function. Additionally, passive components including splitters, combiners, waveguides, etc., do not require power to operate, but do occupy valuable space on a PIC chip. Thus, as the requirement to transmit more data using smaller device sizes becomes increasingly important, there is a need to produce transmitters, receivers and the like using fewer discrete components while minimizing power requirements all at reduced costs.

SUMMARY OF THE INVENTION

Exemplary embodiments of the present invention are directed to an optical circuit employing a dual output laser source. In an exemplary embodiment, an optical circuit includes a substrate having a laser provided thereon. The laser has a first output and a second output opposite the first output. The laser is configured to generate light such that the first output supplies a first portion of the light and the second output supplies a second portion of the light. The circuit further includes a first modulator provided on the substrate where the first modulator is configured to receive the first portion of the light and generate a first modulated optical signal. A second modulator is further provided on the substrate and is configured to receive the second portion of the light and generate a second modulated optical signal.

In another exemplary embodiment, an optical circuit is provided which includes a semiconductor substrate and a distributed feedback laser provided on the semiconductor substrate. The distributed feedback laser includes an active layer provided on the semiconductor substrate which is configured to produce light having a wavelength. A diffraction grating is disposed either above or below the active layer and is spaced a distance from the active layer. The diffraction grating has a predetermined grating period associated with the wavelength of light. A first output of the laser is configured to output a first portion of the light having a first power level. A second output of the laser is configured to output a second portion of the light having a second power level, wherein the first power level is substantially equal to the second power level.

DESCRIPTION OF EMBODIMENTS

Figure 1:
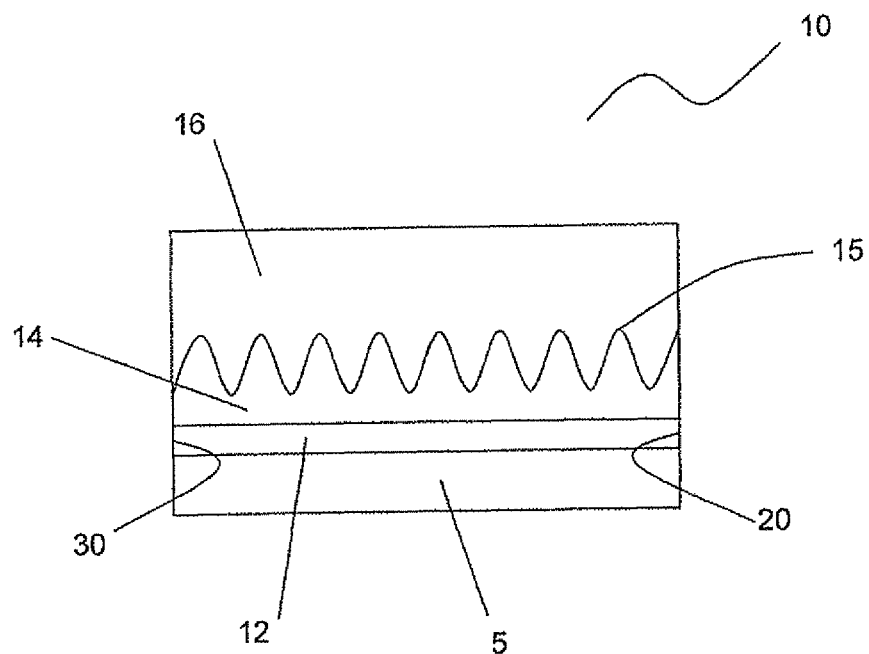
FIG. 1 is a side view of an exemplary laser source in accordance with an embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. It will be understood that when an element or component is referred to herein as being "connected" or "coupled" to another element, it can be directly connected or coupled to the other element or intervening elements may be present therebetween. In contrast, when an element is referred to as being "directly connected" or "directly coupled" to another element, there are no intervening elements present. In the drawings, like numbers refer to like elements throughout.

FIG. 1 is a side view of an exemplary laser source 10 having a first output 20 and a second output 30 opposite the first output. Laser source 10 is a distributed feedback (DFB) laser formed on substrate 5 which may be, for example, n-type InP. Laser 10 may be provided on a PIC chip. An active layer 12 is provided on substrate 5 which has a plurality of quantum wells and oscillates light generated by the input of electric current. A diffraction (or Bragg) grating 15 is disposed between a top layer 16 (comprising a cladding layer) and passive light guiding layer 14. Alternatively, grating 15 may be disposed below active layer 12. These various layers extend between first output 20 and second output 30 on substrate 5. Diffraction grating 15 has a periodic corrugation which replaces cleaved end mirrors of a typical laser. The "feedback" of the laser occurs when the stimulated photons generated by active layer 12 are reflected back to the active layer via grating 15. This reflection occurs along various points over the grating and corresponding points along the active layer implying its "distributed" feature. In addition, the grating selectively reflects photons at a particular wavelength according to the Bragg condition defined by $2\Lambda n_{eff}=\lambda$ where $\Lambda$ is the grating period and $n_{eff}=n \sin \theta$ (where n is the refractive index of the medium). In this manner, laser 10 generates light having a single wavelength $\lambda$.

Because DFB laser 10 does not have any fixed mirrors at the respective ends of the laser cavity, each end of the laser supplies light having approximately the same output power. A first portion of this light having wavelength $\lambda$ is output via first output 20 at a first power level. A second portion of this light having wavelength $\lambda$ is output via second output 30 at a second power level. The first and second power levels may be equal such that each portion of the light generated by the DFB laser 10 is supplied to a plurality of optical modulators as described below. In this manner, laser 10 outputs light from both outputs 20 and 30 of the laser cavity to supply a continuous wave (CW) light source to an optical circuit. Previously the majority of light generated by laser 10 would be directed for output through only one output with light from the other output being terminated by a power-monitoring diode. This power monitoring diode also served to eliminate stray light that would otherwise provide unwanted feedback into the laser cavity, thereby impairing the wavelength control and line-width of the laser. By outputting light generated within the laser cavity through both outputs 20 and 30, additional CW light sources and associated optical components (e.g. splitters) used to direct portions of the laser light to various components within the optical circuit are obviated. In addition, the introduction of associated signal loss, required power for multiple laser sources and valuable chip real estate consumed by these additional CW light sources and associated components is avoided.

Figures 2, 3:
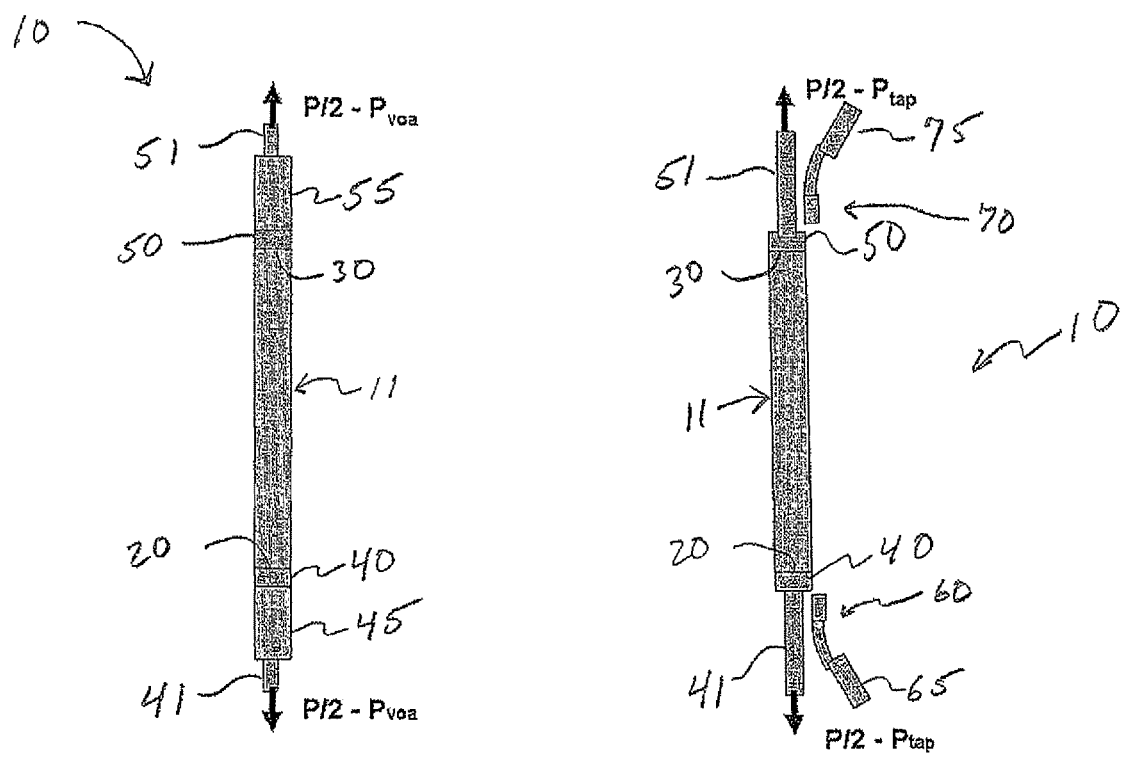
FIG. 2 illustrates an exemplary dual output DFB laser in accordance with an embodiment of the present invention.
FIG. 3 is an alternative embodiment of an exemplary dual output DFB laser in accordance with the present invention.

FIG. 2 is a block diagram illustrating DFB laser 10 having a laser cavity 11, first output 20 coupled to an optical waveguide 40 and second output 30 coupled to an optical waveguide 50. Laser cavity 11 is defined by the layers described with reference to FIG. 1. A variable optical attenuator (VOA) 45 is coupled to waveguide 40. A second VOA 55 is coupled to waveguide 50. Laser 10 and VOAs 45, 55 may be provided on a PIC chip. Each of the VOAs 45 and 55 are used to monitor the power level of the portion of light output from first output 20 and second output 30 respectively. Optical waveguides 40 and 50 may include a light absorbing material and in addition serve to electrically isolate the laser 10 from the VOA's 45 and 50. The combination of the optical waveguide 40 with a light absorbing material and VOA 45 decreases the back reflection of light output from first output 20. Similarly, the combination of the optical waveguide 50 with a light absorbing material and VOA 55 decreases the back reflection of light output from second output 30. In particular, the diffraction grating 15 and active layer 12 form a DFB laser cavity from which light is generated to each of the first and second outputs 20 and 30 as noted above. However, if a strong reflection results from the interface of either the first output with waveguide 40 or second output 30 with waveguide 50, the reflected light returns into the laser cavity 11. This may potentially form an additional or secondary cavity with a Fabry Perot spacing. This secondary cavity competes with the cavity formed by the active layer 12 and the diffraction grating 15 in the laser cavity 11 to determine at what frequency (or wavelength) the DFB laser 10 will operate. This may cause "mode hoping" where the oscillation wavelength of laser 10 changes discontinuously making it difficult to control the output of light at a specified wavelength $\lambda$ associated with the period of grating 15. Thus, waveguide 40 is coupled to VOA power monitor 45 which reduces the back reflection of the portion of light outputted from first output 20 of laser 10. Output waveguide 41 supplies the portion of light outputted via first output 20 to additional optical circuit components. The laser power P1 supplied to waveguide 41 is equal to $P_T/2-PVOA_1$ where $P_T$ is the total output power of laser 10 and $PVOA_1$ is the power absorbed by VOA 45. Similarly, waveguide 50 is disposed between VOA power monitor 55 and output 30 which reduces the back reflection of the portion of light outputted from second output 30 of laser 10. VOA 55 is coupled to an output waveguide 51 which supplies the portion of light outputted via second output 30 to additional optical circuit components. The laser power P2 supplied to waveguide 51 is equal to $P_T/2-PVOA_2$ where $P_T$ is the total output power of laser 10 and $PVOA_2$ is the power absorbed by VOA 55. The amount of light absorbed by VOA 45 and 55 is controlled by the applied voltage to each VOA element. FIG. 3 illustrates an alternative embodiment of dual output DFB laser 10 employing tap waveguides to couple the light from each of the DFB outputs to a power monitor and associated output waveguide while reducing the amount of light lost at the respective outputs. The DFB laser and optical taps may be provided on a PIC chip. Laser 10 includes an optical waveguide 40 coupled to first output 20 and a second optical waveguide 50 coupled to second output 30. A first optical tap 60 is aligned with output waveguide 41 such that the light output from output 20 at wavelength $\lambda$ is evanescently coupled to tap 60. A first power monitor 65 is coupled to tap 60 for monitoring the power of the portion of light output from output 20 of DFB 10. The evanescent coupling reduces the loss associated with light coupled to power monitor 65. A second optical tap 70 is aligned with output waveguide 51 such that the light output from output 30 at wavelength $\lambda$ is evanescently coupled to tap 70. A second power monitor 75 is coupled to tap 70 for monitoring the power of the portion of light output from output 30 of DFB 10. In this manner, less light is lost from each of the outputs 20 and 30 to the respective output waveguides 41 and 51 through the use of evanescent taps 60 and 70.

Figure 4:
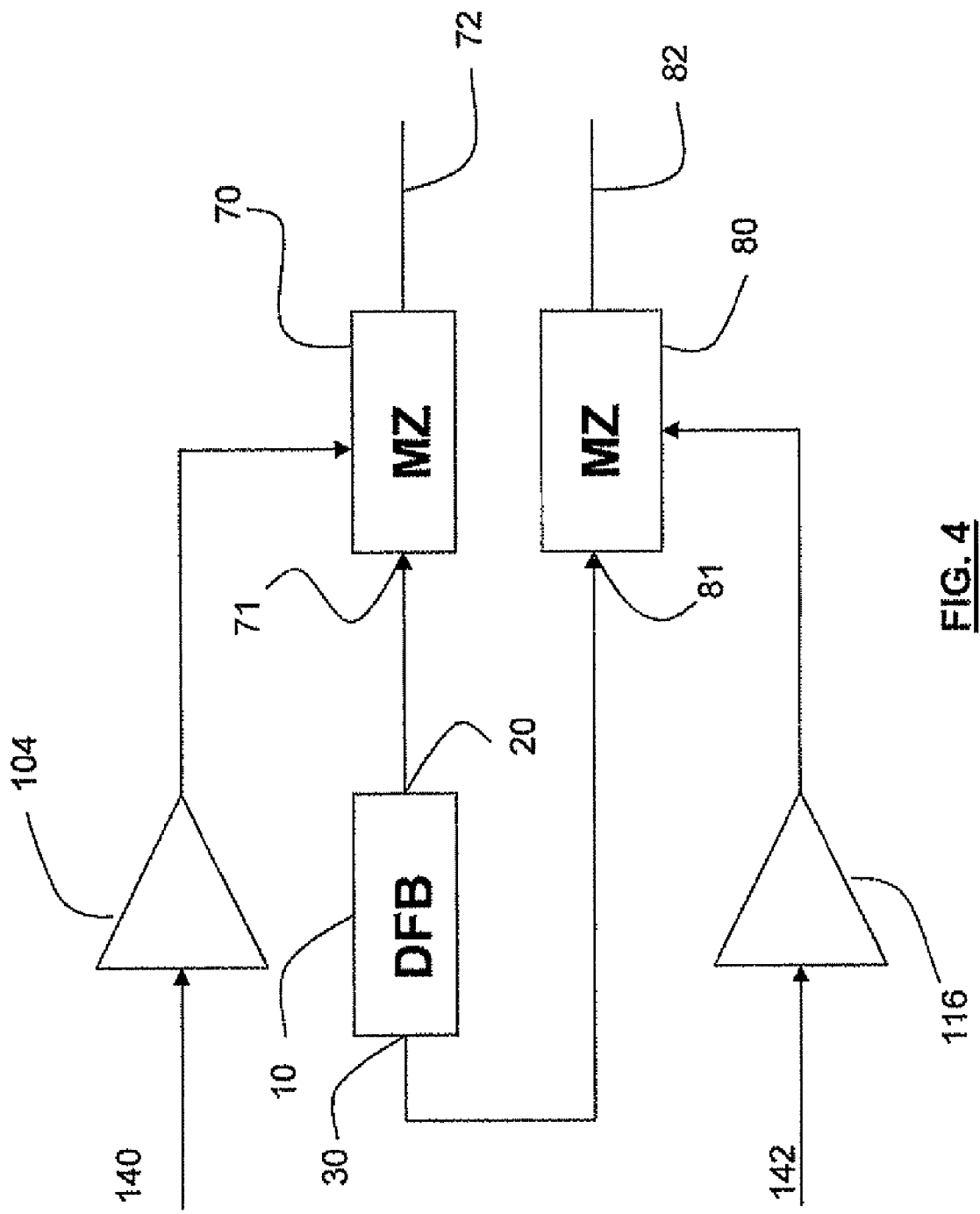
FIG. 4 is a block diagram of an optical circuit in accordance with an embodiment of the present invention.

FIG. 4 illustrates a dual output DFB laser 10 used to drive a plurality of modulators all of which may be provided on a PIC chip. DFB laser 10 supplies CW light to a first modulator 70 and a second modulator 80. In particular, first output 20 of DFB laser 10 supplies a portion of CW light to input 71 of modulator 70. Second (or back) output 30 of DFB laser 10 supplies a portion of CW light to input 81 of modulator 80. First and second modulators 70, 80 may be, for example, Mach Zehnder (MZ) modulators configured to receive respective portions of light from DFB laser 10. A first data stream 140 is supplied to first driver circuit 104 which drives MZ modulator 70. MZ modulator 70 outputs a modulated optical dat$_a$ signal t$_o$ output $_7$2. A second data stream 142 is supplied to sec$_o$nd driver circuit 116 which drives MZ modulator 80. MZ modulator 80 outputs a modulated optical data signal to output 82. The drive signals may be coded for either phase or amplitude based modulation formats. In addition, the losses associated with the paths in each modulator 70 and 80 may be considered when determining the power levels of the light from outputs 20 and 30 respectively especially for signals in the TE and TM modes as they propagate through the modulators. In particular, the power of the first portion of CW light from output 20 may be greater or less than the power of the second portion of CW light from output 30 depending on the loss characteristics associated with the particular modulators 70 and 80. For example, if the output power from each of the modulators 70 and 80 is desired to be equal, but the path losses associated with modulator 70 are greater than the losses associated with modulator 80, then the power of the CW light from output 20 may be greater than the power of the CW light from output 30. Similarly, if the path losses associated with modulator 80 are greater than the losses associated with modulator 70, then the power of the CW light from output 30 may be greater than the power of the CW light from output 20. The power from each output 20 and 30 of DFB 10 may be managed by, for example, VOA's 45 and 55 (shown in FIG. 2). In this manner, DFB 10 may be configured to generate light such that the first output 20 supplies a first portion of the CW light at a first poser level and the second output 30 supplies a second portion of the CW light at a different power level from the first portion such that when the difference in losses in the paths associated with modulators 70 and 80 are considered, the final output power from the modulators is equal.

Figure 5:
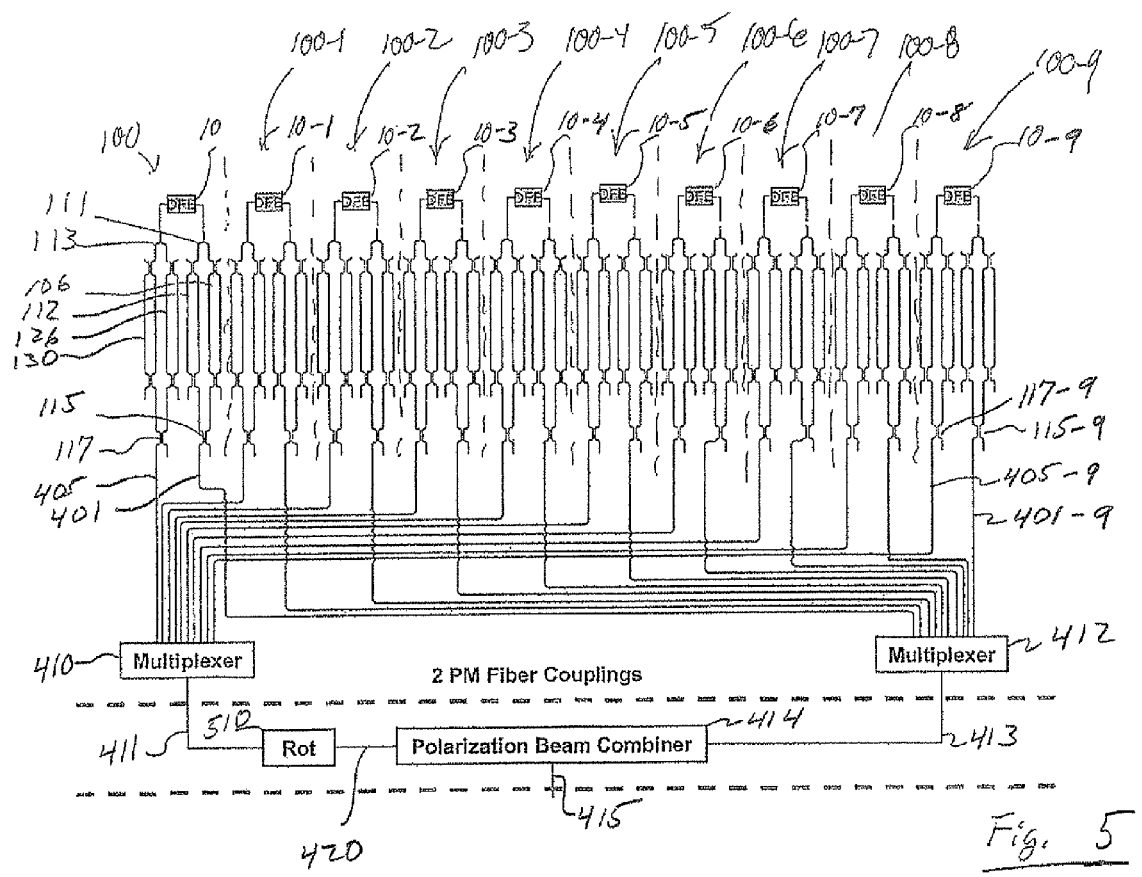
FIG. 5 is a schematic illustration of an optical transmitter circuit in accordance with an embodiment of the present invention.

FIG. 5 is a schematic illustration of an alternative embodiment of the present invention employing dual output DFBs as the CW light source in an optical transmitter implemented on a photonic integrated circuit. In particular, each of the transmitter portions 100 to 100-9 includes dual output DFBs 10 to 10-9 which each output CW light at one of a plurality of wavelengths. The CW light supplied from first output of each of the DFB laser sources 10 to 10-9 is supplied to MZ modulators 106 and 112 via branching units 111. The CW light supplied from second output of each of the DFB laser sources 10 to 10-9 is supplied to MZ modulators 126 and 130 via branching units 113. MZ modulators 106 and 112 supply the modulated optical signals to branching unit 115. MZ modulators 126 and 130 supply the modulated optical signals to branching unit 117. Branching units 115 associated with each of the transmitters 100 to 100-9 supply a first output signal 405 to 405-9. Branching units 117 associated with each of the transmitters 100 to 100-9 supply a second output signal 401 to 401-9. First output signals 405 to 405-9 are combined by first multiplexer 410 and supplied to first waveguide 411 which is coupled between first multiplexer 410 and polarization rotator 510. The multiplexed first output signals 405 to 405-9 are polarization rotated by rotator 510 and supplied to PBC 414 via waveguide 420. Second output signals 401 to 401-9 are combined by second multiplexer 412. Second waveguide 413 is coupled to second multiplexer 412 and supplies the second output signals 401 to 401-9 directly to PBC 414 without being polarization rotated. Each of multiplexers 410 and 412 may be, for example AWGs. PBC 414 combines the multiplexed outputs received via waveguides 420 and 413 and supplies the output to waveguide 415. In this manner, dual output DFBs 10 to 10-9 are utilized in each transmitter portion 100 to 100-9 to provide CW signals modulated by MZ modulators 106, 112, 126 and 130.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An optical circuit comprising:
   a semiconductor substrate; and
   a laser provided on the semiconductor substrate, the laser having first and second outputs, the first output supplying first light and the second output supplying second light;
   a first modulator being configured to modulate the first light to thereby supply a first modulated optical signal carrying first data stream;
   a second modulator being configured to modulate the second light to thereby supply a second modulated optical signal carrying a second data stream;
   a polarization rotator configured to rotate a polarization of the first modulated optical signal, such that the first modulated optical signal has a first polarization and the second modulated optical signal has a second polarization that is different than the first polarization; and
   a polarization beam combiner having an output, the polarization beam combiner being configured to receive the first and second modulated optical signals and combine the first and second modulated optical signals at the output of the polarization beam combiner.

2. An optical circuit in accordance with claim 1, further comprising a variable optical attenuator (VOA) coupled to said first output of the laser, said VOA configured to monitor the power level of or vary an output level of the first light.

3. An optical circuit in accordance with claim 1, further comprising a variable optical attenuator (VOA) coupled to said first output of the laser, said VOA being configured to vary an output level of the first light.

4. An optical circuit in accordance with claim 2, wherein said laser includes an active layer, said VOA is further configured to attenuate part of the first light reflected from said first output of the laser back toward said active layer.

5. An optical circuit in accordance with claim 3, wherein the VOA is a first VOA, the optical circuit further comprising a second VOA coupled to said second output of the laser, said second VOA being configured to monitor the power level of said second light.

6. An optical circuit in accordance with claim 3, wherein the VOA is a first VOA, the optical circuit further comprising a second VOA coupled to said second output of the laser, said second VOA being configured to vary the output level of said second.

7. An optical circuit in accordance with claim 5 wherein said laser includes an active layer, said second VOA is further configured to attenuate part of the second light reflected from said second output of the laser back toward said active layer.

8. An optical circuit in accordance with claim 1 further comprising an optical waveguide coupled to said first output of the laser, said optical waveguide comprising a light absorbing material configured to absorb a portion of said first light.

9. An optical circuit in accordance with claim 8 further comprising a variable optical attenuator (VOA) coupled to said optical waveguide, said VOA being configured to monitor a power level of the first light.

10. An optical circuit in accordance with claim 8, wherein the optical waveguide is a first optical waveguide, the optical circuit further comprising:
    a second optical waveguide coupled to said second output of the laser, said second optical waveguide comprising a light absorbing material configured to absorb a portion of said second light.

11. An optical circuit in accordance with claim 10, wherein the VOA is a first VOA, the optical circuit further comprising a second VOA coupled to said second optical waveguide, said second VOA configured to monitor a power level of the second light.

12. An optical circuit in accordance with claim 1 further comprising:
   an optical waveguide coupled to said first output of the laser, the optical waveguide receiving the first light, and
   an optical tap configured to receive a portion of said first light from said optical waveguide.

13. An optical circuit in accordance with claim 12 wherein said optical waveguide includes a light absorbing material configured to absorb a predetermined amount of said portion of said first light.

14. An optical circuit in accordance with claim 12 further comprising an optical power monitor coupled to said optical tap, said power monitor configured to monitor a power level of the first light.

15. An optical circuit in accordance with claim 1, wherein the optical waveguide is a first optical waveguide and the optical tap is a first optical tap, the optical circuit further comprising:
   a second optical waveguide coupled to said second output of the laser, and
   second optical tap configured to receive a portion of said first light from said optical waveguide.

16. An optical circuit in accordance with claim 15 wherein said second optical waveguide includes a light absorbing material configured to absorb a predetermined amount of said portion of said second light.

17. An optical circuit in accordance with claim 15 further comprising an optical power monitor coupled to said second optical tap, said power monitor configured to monitor a power level of the second light.

18. An optical circuit, comprising:
   a laser provided, the laser having a first output and a second output opposite the first output, the laser being configured to generate light such that the first output supplies a first portion of the light and the second output supplies a second portion of the light;
   a first modulator provided, the first modulator being configured to receive the first portion of the light and generate a first modulated optical signal carrying a first data stream;
   a second modulator provided, the second modulator being configured to receive the second portion of the light and generate a second modulated optical signal carrying a second data stream;
   a polarization rotator configured to rotate a polarization of the first modulated optical signal, such that the first modulated optical signal has a first polarization and the second modulated optical signal has a second polarization that is different than the first polarization; and
   a polarization beam combiner having an output, the polarization beam combiner being configured to receive the first and second modulated optical signals and combine the first and second modulated optical signals at the output of the polarization beam combiner.

19. An optical circuit in accordance with claim 18 wherein said laser is a distributed feedback laser.

20. An optical circuit in accordance with claim 18 wherein said first modulator is a Mach-Zender modulator.

21. An optical circuit in accordance with claim 18 wherein said second modulator is a Mach-Zender modulator.

22. An optical circuit in accordance with claim 18 wherein said first portion of the light is a continuous wave signal.

23. An optical circuit in accordance with claim 18 wherein said second portion of the light is a continuous wave signal.

24. An optical circuit in accordance with claim 23, further comprising a variable optical attenuator (VOA) coupled to said first output of the laser, said VOA being configured to monitor a power level of said first portion of the light supplied from said first output.

25. An optical circuit in accordance with claim 23, wherein said VOA is further configured to attenuate part of the first portion of the light reflected from said first output of the laser back toward said laser.

26. An optical circuit in accordance with claim 18 further comprising a variable optical attenuator (VOA) coupled to said second output, said VOA being configured to monitor a power level of said second portion of the light supplied from said second output of the laser.

27. An optical circuit in accordance with claim 26, wherein said VOA is further configured to attenuate part of the first portion of the light reflected from said first output of the laser back toward said laser.

28. An optical circuit, comprising:
   a substrate;
   a laser provided on the substrate, the laser having a first output and a second output opposite the first output, the laser being configured to generate light such that the first output supplies a first portion of the light at a first power level and the second output supplies a second portion of the light;
   a first modulator provided on the substrate, the first modulator having a first optical loss characteristic and being configured to receive the first portion of the light and generate a first modulated optical signal carrying a first data stream;
   a second modulator provided on the substrate, the second modulator having a second optical loss characteristic and being configured to receive the second portion of the light and generate a second modulated optical signal carrying second data stream;
   a polarization rotator configured to rotate a polarization of the first modulated optical signal, such that the first modulated optical signal has a first polarization and the second modulated optical signal has a second polarization that is different than the first polarization; and
   a polarization beam combiner having an output, the polarization beam combiner being configured to receive the first and second modulated optical signals and combine the first and second modulated optical signals at the output of the polarization beam combiner,
   wherein the first power level of the first portion of the light corresponds to the first optical loss characteristic and the second power level of the second portion of the light corresponds to the second optical loss characteristic such that the first modulated optical signal has a power level substantially equal to a power level of the second modulated optical signal.

* * * * *